(12) United States Patent
Huang et al.

(10) Patent No.: US 10,629,524 B2
(45) Date of Patent: Apr. 21, 2020

(54) MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Peng Huang, Shanghai (CN); Xue Hai Zhang, Shanghai (CN); Chuan Miao Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/905,608

(22) Filed: Feb. 26, 2018

(65) Prior Publication Data

US 2018/0254244 A1 Sep. 6, 2018

(30) Foreign Application Priority Data

Mar. 1, 2017 (CN) .......................... 2017 1 0117402

(51) Int. Cl.
| | | |
|---|---|---|
| *H01L 23/522* | (2006.01) | |
| *H01L 23/528* | (2006.01) | |
| *H01L 23/532* | (2006.01) | |
| *H01L 21/768* | (2006.01) | |
| *G11C 7/02* | (2006.01) | |
| *G11C 5/06* | (2006.01) | |
| *H01L 27/115* | (2017.01) | |
| *G11C 7/18* | (2006.01) | |
| *G11C 8/14* | (2006.01) | |
| *H01L 27/11521* | (2017.01) | |

(52) U.S. Cl.
CPC ............ *H01L 23/5225* (2013.01); *G11C 7/02* (2013.01); *H01L 21/768* (2013.01); *H01L 23/5226* (2013.01); *H01L 23/5286* (2013.01); *H01L 23/53214* (2013.01); *H01L 23/53228* (2013.01); *H01L 23/53271* (2013.01); *G11C 5/063* (2013.01); *G11C 7/18* (2013.01); *G11C 8/14* (2013.01); *H01L 27/115* (2013.01); *H01L 27/11521* (2013.01)

(58) Field of Classification Search
None
See application file for complete search history.

(56) References Cited

U.S. PATENT DOCUMENTS 7,199,054 B2* 4/2007 Nakamura .............. H01L 21/84
257/E21.646
2017/0278830 A1* 9/2017 Kim .................... H01L 23/3736

FOREIGN PATENT DOCUMENTS

CN 101075614 A 11/2007

* cited by examiner

Primary Examiner — Long Pham
(74) Attorney, Agent, or Firm — Anova Law Group, PLLC

(57) ABSTRACT

A memory and a method for fabricating the memory are provided. The memory includes a bit-line layer on a semiconductor substrate and having bit lines arranged in the bit-line layer. The memory also includes a shielding layer on the bit-line layer and having a conductive shielding structure arranged in the shielding layer. The conductive shielding structure is within a top-view projection area of the bit lines and is grounded. Further, the memory includes a word-line layer on the shielding layer and having word lines arranged in the word-line layer.

13 Claims, 3 Drawing Sheets

MEMORY AND FABRICATION METHOD THEREOF

CROSS-REFERENCES TO RELATED APPLICATIONS

This application claims the priority of Chinese patent application No. 201710117402.3, filed on Mar. 1, 2017, the entirety of which is incorporated herein by reference.

FIELD OF THE DISCLOSURE

The present disclosure generally relates to the field of semiconductor technology and, more particularly, relates to a memory and a fabrication method thereof.

BACKGROUND

A memory is a basic device in the field of semiconductor technology. The memory usually includes a memory structure in a substrate and logical lines related to read and write operations including bit lines and word lines. When a chip includes a memory, the performance of the memory has a large impact on the yield of the chip.

However, the write interference of the conventional memory is large, and the performance of the conventional memory still needs to be improved. The disclosed device structures and methods are directed to solve one or more problems set forth above and other problems.

BRIEF SUMMARY OF THE DISCLOSURE

One aspect of the present disclosure includes a memory. The memory includes a bit-line layer on a semiconductor substrate and having bit lines arranged in the bit-line layer. The memory also includes a shielding layer on the bit-line layer and having a conductive shielding structure arranged in the shielding layer. The conductive shielding structure is within a top-view projection area of the bit lines and is grounded. Further, the memory includes a word-line layer on the shielding layer and having word lines arranged in the word-line layer.

Another aspect of the present disclosure includes a method for fabricating a memory. The method includes providing a bit-line layer on a semiconductor substrate and having bit lines arranged in the bit-line layer. The method also includes providing a shielding layer on the bit-line layer and having a conductive shielding structure arranged in the shielding layer. The conductive shielding structure is within a top-view projection area of the bit lines and is grounded. Further, the method includes providing a word-line layer on the shielding layer and having word lines arranged in the word-line layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
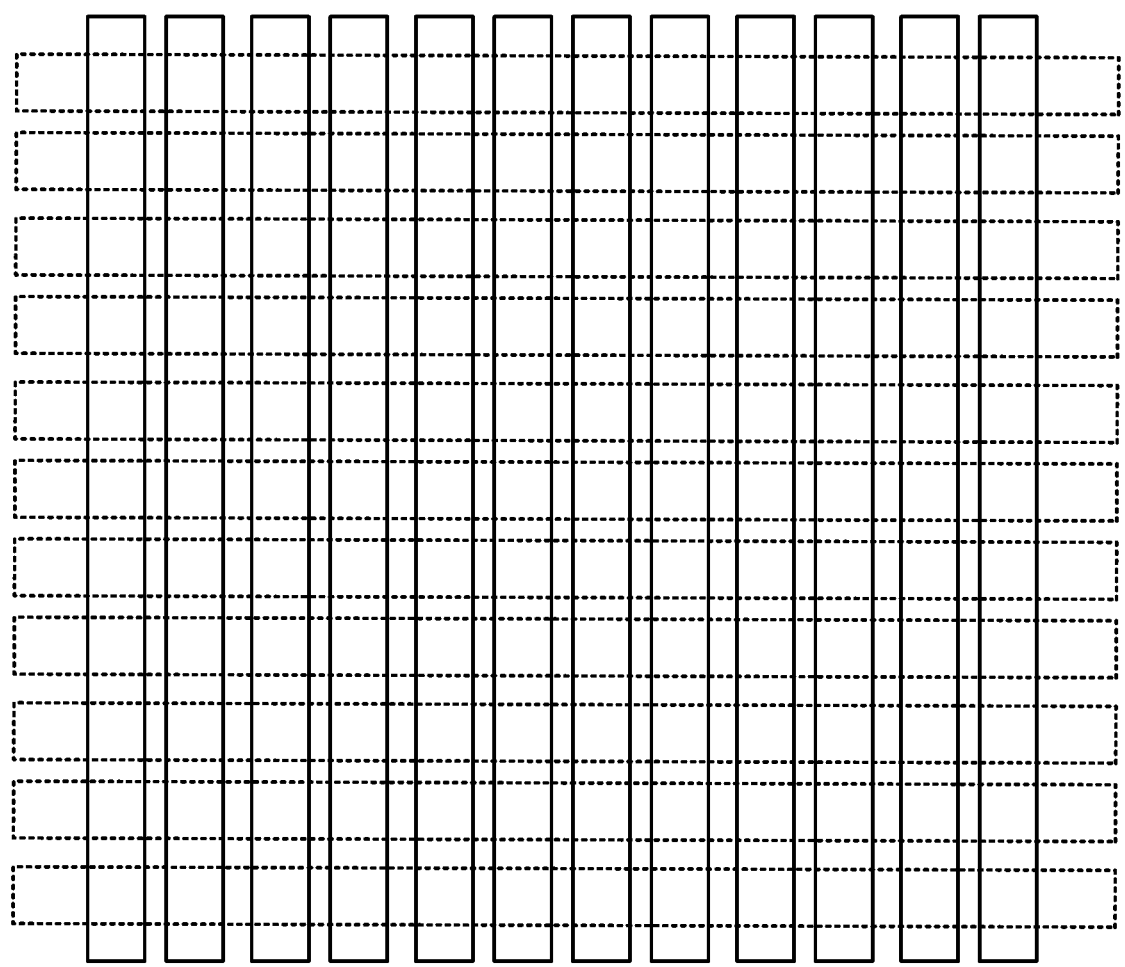
FIG. 1 illustrates a schematic diagram of a position relationship between word lines and bit lines in an exemplary memory consistent with various disclosed embodiments of the present disclosure.

In an exemplary memory structure, word lines may be distributed perpendicular to bit lines. Referring to FIG. 1, solid-line portions may represent the bit lines, and dashed-line portions may represent the word lines. The word lines may be located in a word-line layer, and the bit lines may be located in a bit-line layer. The bit-line layer may be on a semiconductor substrate, a shielding layer may be on the bit-line layer, and the word-line layer may be on the shielding layer.

In the present disclosure, that one layer is on another layer means a layer is directly above or indirectly above another layer. In other words, the two layers may be directly adjacent to each other, or may be spaced by other layers or other structures.

The distribution of the word lines and the bit lines is not limited to the manner illustrated in FIG. 1. For example, the word lines may be distributed un-perpendicular to the bit lines.

The shielding layer may include a conductive shielding structure. The conductive shielding structure in the shield layer may be grounded to avoid the accumulation of charges in the shielding structure.

Figure 2:
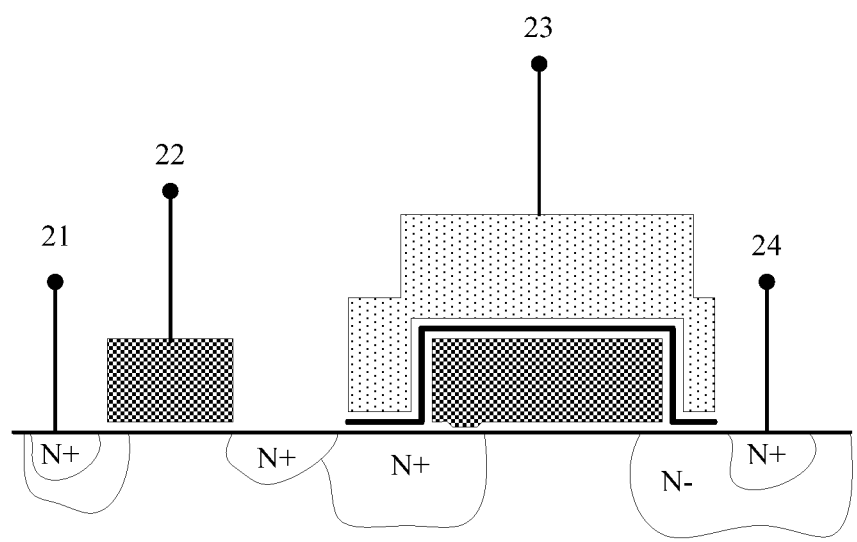
FIG. 2 illustrates a cross-sectional view of a memory structure of another exemplary memory consistent with various disclosed embodiments of the present disclosure.

A memory structure may be formed in the semiconductor substrate. FIG. 2 illustrates a cross-sectional view of the memory structure. The memory structure may include a drain 21, a selection gate 22, a control gate 23, and a source 24.

In one embodiment, the shielding structure may be within a top-view projection area of the bit lines, and an edge of the shielding structure may coincide with entire or portions of the projection area of the bit lines. The top-view direction may be referred to a direction perpendicular to the surface of the semiconductor substrate.

The shielding structure may include comb-shaped metal structures. The comb-shaped metal structures may be within the top-view projection area of the bit lines. The number of the comb-shaped metal structures within the top-view projection area of each bit line may be one or more.

The comb-shaped metal structure within the top-view projection area of each bit line may include a first comb-shaped metal structure and a second comb-shaped metal structure that are engaged with each other. Both the first comb-shaped metal structure and the second comb-shaped metal structure may be grounded.

It may be difficult to implement a process for providing a metal structure having the same area as the projection area of the bit line within the top-view projection area of each bit line, and a thickness of the metal structure may be non-uniform. The comb-shaped metal structure may be easily implemented in the process for forming the memory. The shielding structure may also include other shapes, and is not limited to the comb-shape.

The metal structures provided within the top-view projection area of the bit lines may have a desired shielding effect. Since a coupling voltage results from the bit lines, the shielding structure within the projection area of the bit lines may reduce the coupling voltage. Other components, such as a component having logical interconnection functions, may be provided in the regions of the shielding layer outside the shielding structure. Thus, the write interference between the bit line and the adjacent bit lines may be reduced during the write operation by providing the shielding structure within the projection area of the bit lines, and the regions of the shielding layer outside the shielding structure may be sufficiently utilized.

Other structures, such as a connection structure, may be provided in the regions of the shielding layer outside the top-view projection area of the bit lines. In one embodiment, the connection structure may be provided to electrically connect one of the word line and the bit line to the memory structure in the semiconductor substrate. In another embodiment, a logical interconnection structure may be provided to connect to a memory peripheral logic circuit to implement the logical functions.

In one embodiment, the connection structure may be electrically isolated from the shielding structure, and may connect the word line to the gate of the memory structure. In another embodiment, when the shielding layer is provided between the bit lines and the semiconductor substrate, the shielding structure may connect the bit lines to the memory structure in the semiconductor substrate. In certain embodiments, the shielding structure may connect other control lines to the memory structure.

The shielding structure may be provided not within the top-view projection area of the bit lines. In one embodiment, the shielding structure may be provided in accordance to the bit lines, and the area where the shielding structure is located may be smaller or larger than the projection area of the bit lines. In another embodiment, the shielding structure may be provided in accordance to the word lines, and may be provided within a top-view projection area of the word lines. In certain embodiments, the shielding structure may be provided in other manners.

Figure 3:
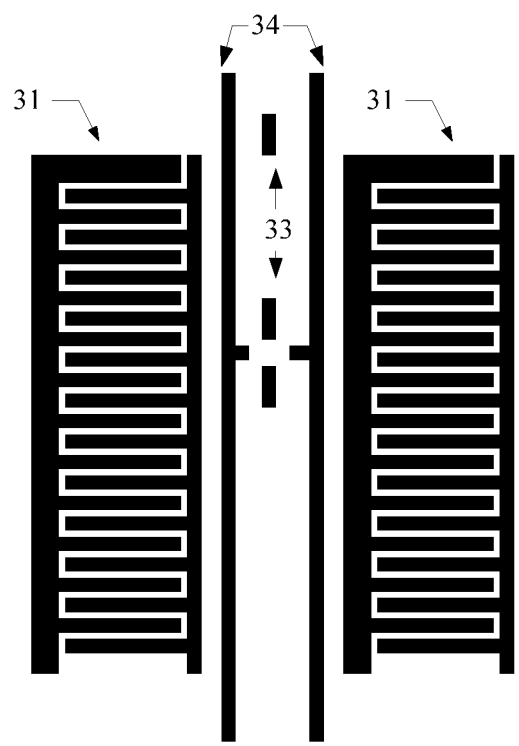
FIG. 3 illustrates a schematic diagram of a portion of a shielding layer of another exemplary memory consistent with various disclosed embodiments of the present disclosure.

FIG. 3 illustrates a schematic diagram of a portion of the shielding layer consistent with disclosed embodiments. Referring to FIG. 3, the shielding layer may include comb-shaped metal structures 31 within the top-view projection area of the bit lines. FIG. 3 illustrates two comb-shaped metal structures 31 respectively corresponding to different bit lines. Each comb-shaped metal structure 31 may include a first comb-shaped metal structure and a second comb-shaped metal structure having their comb teeth engaged with each other. Both the first comb-shaped metal structure and the second comb-shaped metal structure may be grounded.

In one embodiment, the shielding layer may include a connection structure 33 for electrically connecting one of the word line and the bit line to the memory structure in the semiconductor substrate. For example, the connection structure 33 may connect the word line and the selection gate 22 illustrated in FIG. 2.

In one embodiment, the shielding layer may include a logical interconnection structure 34 for connecting to a peripheral logic circuit of the memory to implement the logical functions.

The comb-shaped metal structure 31, the connection structure 33, and the logical interconnection structure 34 in the shielding layer may be made of a conductive material, such as copper, aluminum, or polysilicon, etc.

Figure 4:
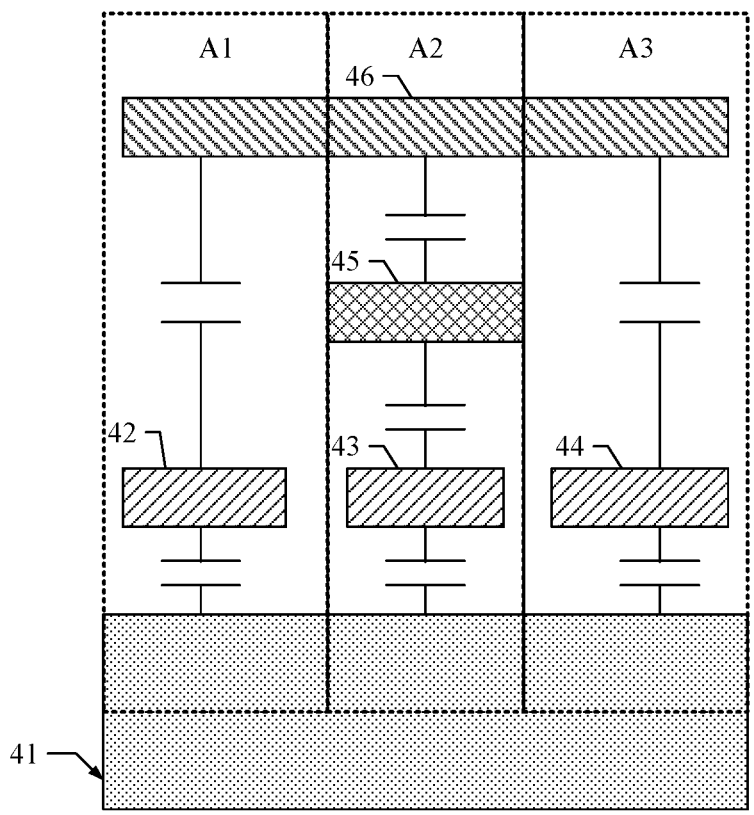
FIG. 4 illustrates a schematic diagram of a portion of another exemplary memory consistent with various disclosed embodiments of the present disclosure.

FIG. 4 illustrates a schematic diagram of a portion of a memory consistent with disclosed embodiments. Referring to FIG. 4, the exemplary memory may include a semiconductor substrate 41, three exemplary bit lines 42, 43, and 44, a portion of the shielding structure 45 and a word line 46. The bit lines 42, 43, and 44 may be in a first metal layer, the shielding structure 45 may be in a second metal layer, and the word line 46 may be in a third metal layer.

When performing a write operation on a bit line, a high voltage may need to be applied on the bit line, causing interference to adjacent bit lines. The interference between the bit line and the adjacent bit lines may result from the coupling voltage, and the value of the coupling voltage may be related to the capacitance and the voltage of each portion of the memory. The capacitance of the bit line may include a capacitance between the metal layer where the bit line is located and the substrate, a capacitance between the metal layer where the bit line is located and the word line, a capacitance between the bit line and the adjacent bit lines, and a capacitance between the metal layer where the bit line is located and the control gate.

The coupling voltage between the shielding layer and the metal layer where the bit line is located may be converted into a coupling voltage between the ground and the metal layer where the bit line is located by providing the shielding layer and grounding the shielding structure 45. Therefore, the coupling voltage of the metal layer where the bit line is located may be reduced, and the interference in a programming operation may be reduced.

In one embodiment, referring to FIG. 4, in a non-limiting example, in other words, when '0' is stored in the memory cells corresponding to the bit line 42 and the bit line 44, and '1' is written into the memory cell through the bit line 43 in the middle position, the voltage on the bit line 43 in the middle position as an example may be referred to Equation 1 according to the law of conservation of electric charge when the shielding structure 45 is not provided:

$$V(BL(1)) = \frac{VBL(0)*CBL(0)*2 + V(cg)*C(cg) + V(wl)*C(wl) + V(sub)*C(sub)}{CBL(0)*2 + C(cg) + C(wl) + C(sub)}; \quad (1)$$

where, the voltage on the bit line 42 may be equal to the voltage on the bit line 44, and may be referred to 'VBL(0)'; the bit line capacitance in the region 'A1' where the bit line 42 is located may be equal to the bit line capacitance in the region 'A3' where the bit line 44 is located, and may be referred to 'CBL (0)'; 'V (cg)' may represent the control gate voltage (such as the voltage on the control gate 23 illustrated in FIG. 2); 'C (cg)' may represent the capacitance of the control gate; 'V (wl)' may represent the word line voltage (the voltage on the word line); 'C (wl)' may represent the word line capacitance; 'V (sub)' may represent the substrate voltage; and 'C (sub)' may represent the substrate capacitance.

When the shielding structure 45 is provided, the voltage on the bit line 43 in the middle position may be referred to Equation 2 according to the law of conservation of electric charge:

$$V(BL(1)) = \frac{VBL(0)*CBL(0)*2 + V(cg)*C(cg) + V(wl)*C(wl) + V(sub)*C(sub) + V(M2\_0)*C(M2\_0)}{CBL(0)*2 + C(cg) + C(wl) + C(sub) + C(M2\_0)}; \quad (2)$$

where 'V (M2-0)' may represent the voltage on the shielding layer, and the 'C (M2-0)' may represent the capacitance of the shielding layer. Since the shielding structure is ground, the value of 'V (M2-0)' may be zero. Thus, compared to the Equation 1, the numerator of Equation 2 may be equal to the numerator of Equation 1, while the denominator of Equation 2 may be 'C (M2-0)' larger than the denominator of Equation 1. Therefore, the coupling voltage of the bit line 43 in the middle position may be reduced after providing the shielding structure 45, and the influence on the bit lines on both sides of the bit line 43 may be reduced.

The following four structures may be provided for comparison. In structure 'A': Providing a bit line in the first metal layer, and providing a word line in the second metal layer. In structure 'B': Providing a bit line in the first metal layer, and providing a word line in the third metal layer (the second metal layer may be not ground). In structure 'C': Providing a bit line in the first metal layer and the second metal layer, and providing a word line in the third metal layer. In structure 'D': Providing a bit line in the first metal layer, proving a word line in the third metal layer, and providing a shielding layer that is ground in the second metal layer. The detailed comparison results are shown in Table 1.

'V_M1BL' may represent the coupling voltage in units of 'V', 'C_M1BL' may represent the capacitance, between the first metal layer and each portion represented in the first row of the Table 1, in units of 'fF'. 'V_M2BL' may represent the voltage, coupled to the bit line in the second metal layer, in units of 'V', and 'C_M2BL' may represent the capacitance, between the second metal layer and each portion represented in the first row of the Table 1, in units of 'fF'.

'BL_(1)' may represent a bit line storing a data '1', BL_(0)' may represent a bit line storing a data '0', 'CG' may represent the control gate, 'WL' may represent the word line, 'Sub' may represent the substrate, and 'M2_0' may represent the disclosed shielding layer.

TABLE 1

| Voltage, Capacitance | | BL_(1) | BL_(0) | CG | WL | Sub | M2_0 |
|---|---|---|---|---|---|---|---|
| A | V_M1BL | 8.9 | 13 | 0 | 16 | 0 | NA |
|   | C_M1BL | 0.6732 | 0.3580 | 0.1320 | 0.0822 | 0.1010 | |
| B | V_M1BL | 8.5 | 13 | 0 | 16 | 0 | |
|   | C_M1BL | 0.6381 | 0.3580 | 0.1320 | 0.0471 | 0.1010 | |
| C | V_M1BL | 7.4 | 13 | 0 | 16 | 0 | |
|   | C_M1BL | 0.5121 | 0.2320 | 0.1320 | 0.0471 | 0.1010 | |
|   | V_M2BL | 10.4 | 13 | 0 | 16 | 0 | |
|   | C_M2BL | 0.4450 | 0.2540 | 0.0078 | 0.0822 | 0.1010 | |
| D | V_M1BL | 6.7 | 13 | 0 | 16 | 0 | 0 |
|   | C_M1BL | 0.8021 | 0.3580 | 0.1320 | 0.0471 | 0.1010 | 0.1640 |

Referring to Table 1, the coupling voltage on the BL_(1) in the disclosed structure 'D' is the smallest, and may have minimum influence on adjacent bit lines.

Figure 5:
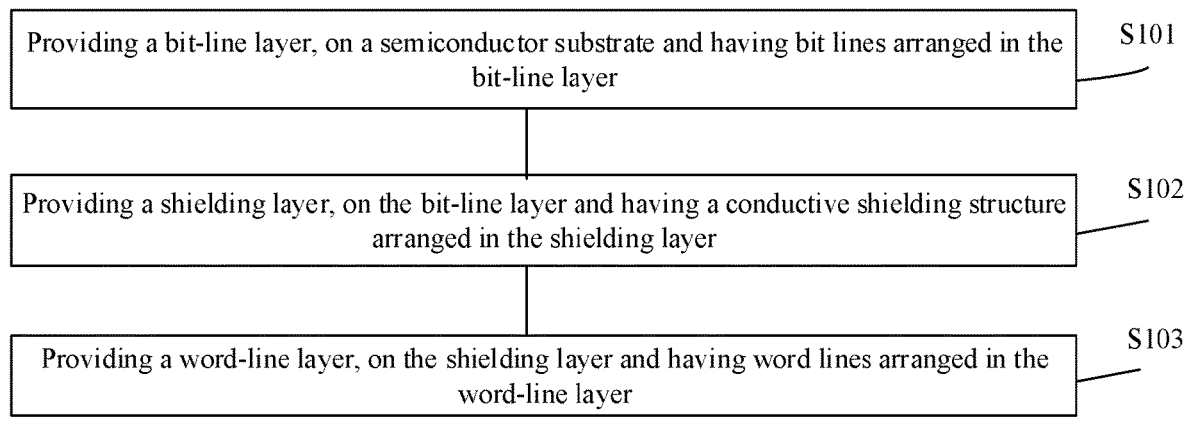
FIG. 5 illustrates an exemplary fabrication method for forming a memory consistent with various disclosed embodiments of the present disclosure.

The present disclosure also provides a method for fabricating a memory. FIG. 5 illustrates a flowchart of the exemplary fabrication method for forming the memory. Referring to FIG. 5, the method may include the following.

S101: Providing a bit-line layer on a semiconductor substrate. Bit lines may be provided in the bit-line layer. The method may also include providing a shielding layer on the bit-line layer.

S102: Providing a shielding layer on the bit-line layer. Conductive shielding structure may be provided in the shielding layer. The conductive shielding structure in the shield layer may be grounded to avoid the accumulation of charges in the shielding structure. In one embodiment, the shielding structure may be within a top-view projection area of the bit lines, and an edge of the shielding structure may coincide with entire or portions of a projection area of the bit lines. The shielding structure may be made of a conductive material, such as copper, aluminum, or polysilicon, etc. The shielding structure may include comb-shaped metal structures. Each comb-shaped metal structure may include a first comb-shaped metal structure and a second comb-shaped metal structure that are engaged with each other. Both the first comb-shaped metal structure and the second comb-shaped metal structure may be grounded.

S103: Providing a word-line layer on the shielding layer. Word lines may be provided in the word-line layer.

In one embodiment, the method may also include providing a memory structure in the semiconductor substrate. The memory structure may include a drain, a selection gate, a control gate, and a source. In addition, the method may include providing a connection structure in the shielding layer and electrically isolated from the conductive shielding structure. The connection structure may electrically connect one of the word line and the bit line to the memory structure in the semiconductor substrate. In another embodiment, the method may include providing a logical interconnection structure in the shielding layer outside a top-view projection area of the bit lines. The logical interconnection structure is made of one of copper, aluminum and polysilicon.

As disclosed herein, the shielding layer may be provided on the bit-line layer. When performing a write operation via a bit line, a high voltage may need to be applied on the bit line, causing write interference to adjacent bit lines. The write interference between the bit line and adjacent bit lines may usually result from the coupling voltage. The coupling voltage may be reduced by providing the shielding layer and grounding the shielding structure, and the coupling capacitance between the bit-line layer and adjacent metal layers may be converted into a coupling capacitance between the bit-line layer and ground. The write interference between the bit line and the adjacent bit lines thereof may be further reduced.

Further, the shielding structure may be within the projection area of the bit line. In other words, the bit line in the memory may be covered with the shielding structure. Since the coupling voltage results from the bit line, the shielding structure within the projection area of the bit line may reduce the coupling voltage. Other components, such as a component having logical interconnection functions, may be provided in the regions of the shielding layer outside the shielding structure. Thus, the write interference between the bit line and the adjacent bit lines may be reduced during the write operation by providing the shielding structure within the projection area of the bit line, and the regions of the shielding layer outside the shielding structure may be sufficiently utilized.

In one embodiment, the disclosed memory may be an electrically erasable programmable read-only memory (EEPROM). In another embodiment, the disclosed memory may be a memory in a contact IC card, such as a memory in a bank card. The yield of the IC card may be greatly improved, approximately 20%, by using the disclosed memory.

The above detailed descriptions only illustrate certain exemplary embodiments of the present disclosure, and are not intended to limit the scope of the present disclosure.

Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A memory, comprising:
a bit-line layer, on a semiconductor substrate and having bit lines arranged in the bit-line layer;
a shielding layer, on the bit-line layer and having a conductive shielding structure arranged in the shielding layer, wherein the conductive shielding structure is within a top-view projection area of the bit lines and is grounded; and
a word-line layer, on the shielding layer and having word lines arranged in the word-line layer, wherein:
the conductive shielding structure includes comb-shaped metal structures.

2. The memory according to claim 1, wherein:
each comb-shaped metal structure of the conductive shielding structure includes a first comb-shaped metal structure and a second comb-shaped metal structure having comb teeth engaged with each other; and
both the first comb-shaped metal structure and the second comb-shaped metal structure are grounded.

3. A memory, comprising:
a bit-line layer, on a semiconductor substrate and having bit lines arranged in the bit-line layer;
a shielding layer, on the bit-line layer and having a conductive shielding structure arranged in the shielding layer, wherein the conductive shielding structure is grounded and a top-view projection area of the bit lines are completely covered by a top-view projection area of the conductive shielding structure; and
a word-line layer, on the shielding layer and having word lines arranged in the word-line layer;
a memory structure in the semiconductor substrate, including a drain, a selection gate, a control gate, and a source; and
a connection structure, in the shielding layer and electrically isolated from the conductive shielding structure, wherein the connection structure electrically connects one of the word line and the bit line to the memory structure in the semiconductor substrate.

4. The memory according to claim 3, wherein:
the connection structure is outside a top-view projection area of the bit lines.

5. The memory according to claim 3, wherein:
the word line is connected to the selection gate of the memory structure via the connection structure.

6. A memory, comprising:
a bit-line layer, on a semiconductor substrate and having bit lines arranged in the bit-line layer;
a shielding layer, on the bit-line layer and having a conductive shielding structure arranged in the shielding layer, wherein the conductive shielding structure is grounded and a top-view projection area of the bit lines are completely covered by a top-view projection area of the conductive shielding structure;
a word-line layer, on the shielding layer and having word lines arranged in the word-line layer; and
a logical interconnection structure, in the shielding layer outside a top-view projection area of the bit lines, wherein:
the logical interconnection structure is made of one or more of copper, aluminum and polysilicon.

7. The memory according to claim 1, wherein:
the conductive shielding structure is made of one or more of copper, aluminum, and polysilicon.

8. The memory according to claim 1, further including:
a memory structure in the semiconductor substrate, including a drain, a selection gate, a control gate, and a source.

9. The memory according to claim 1, further including:
a logical interconnection structure, in the shielding layer outside a top-view projection area of the bit lines, wherein:
the logical interconnection structure is made of one or more of copper, aluminum and polysilicon.

10. The memory according to claim 3, wherein:
the conductive shielding structure is made of one or more of copper, aluminum, and polysilicon.

11. The memory according to claim 3, further including:
a memory structure in the semiconductor substrate, including a drain, a selection gate, a control gate, and a source.

12. The memory according to claim 6, wherein:
the conductive shielding structure is made of one or more of copper, aluminum, and polysilicon.

13. The memory according to claim 6, further including:
a memory structure in the semiconductor substrate, including a drain, a selection gate, a control gate, and a source.

* * * * *